United States Patent
Miyazaki et al.

(10) Patent No.: US 9,558,971 B2
(45) Date of Patent: Jan. 31, 2017

(54) SUBSTRATE HOLDING APPARATUS AND SUBSTRATE CLEANING APPARATUS

(71) Applicant: Ebara Corporation, Tokyo (JP)

(72) Inventors: Mitsuru Miyazaki, Tokyo (JP); Takuya Inoue, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 14/309,287

(22) Filed: Jun. 19, 2014

(65) Prior Publication Data

US 2014/0373289 A1 Dec. 25, 2014

(30) Foreign Application Priority Data

Jun. 24, 2013 (JP) .................................. 2013-131409

(51) Int. Cl.
*H01L 21/67* (2006.01)
*H01L 21/687* (2006.01)

(52) U.S. Cl.
CPC ... *H01L 21/67046* (2013.01); *H01L 21/67051* (2013.01); *H01L 21/68728* (2013.01); *H01L 21/687* (2013.01)

(58) Field of Classification Search
CPC ............. H01L 21/687; H01L 21/67046; H01L 21/683; H01L 21/6872
USPC .................................................. 269/58, 218
See application file for complete search history.

(56) References Cited

U.S. PATENT DOCUMENTS

| 5,772,773 A * | 6/1998 | Wytman ........... H01L 21/67103 118/729 |
| 6,051,113 A * | 4/2000 | Moslehi ................ C23C 14/568 118/719 |
| 6,120,609 A * | 9/2000 | Selyutin .............. C23C 16/4583 118/500 |
| 6,151,744 A * | 11/2000 | Ohtani .............. H01L 21/67051 15/21.1 |
| 6,358,324 B1 * | 3/2002 | Hongoh .............. C23C 16/0209 118/713 |
| 6,385,805 B2 * | 5/2002 | Konishi .................... B08B 1/04 134/902 |
| 6,543,079 B1 * | 4/2003 | Yeo ................... H01L 21/67051 15/102 |
| 7,547,860 B2 * | 6/2009 | Tanaka et al. ........... 219/121.43 |

(Continued)

FOREIGN PATENT DOCUMENTS

| JP | 63-153839 | 6/1988 |
| JP | 06-037077 | 2/1994 |

(Continued)

*Primary Examiner* — Michael Jennings
(74) *Attorney, Agent, or Firm* — Leydig, Voit & Mayer, Ltd.

(57) ABSTRACT

A substrate holding apparatus capable of reducing an amount of deflection of a substrate, such as a wafer, is disclosed. The substrate holding apparatus includes: a plurality of chucks configured to hold a peripheral edge of a substrate; at least one support member disposed below the substrate; and an actuating device configured to bring the chucks into contact with the peripheral edge of the substrate while elevating the support member to bring the support member into contact with a lower surface of the substrate, and configured to move the chucks in a direction away from the peripheral edge of the substrate while lowering the support member to separate the support member away from the lower surface of the substrate.

8 Claims, 5 Drawing Sheets

(56) References Cited

U.S. PATENT DOCUMENTS

| | | | |
|---|---|---|---|
| 8,951,359 B2* | 2/2015 | Inada | H01L 21/67051 134/26 |
| 2001/0010103 A1* | 8/2001 | Konishi et al. | 15/77 |
| 2001/0029150 A1* | 10/2001 | Kimura | B24B 9/065 451/41 |
| 2003/0106571 A1* | 6/2003 | Kamikawa | H01L 21/67051 134/25.4 |
| 2003/0166382 A1* | 9/2003 | Ashjaee et al. | 451/54 |
| 2004/0079396 A1* | 4/2004 | Jeong et al. | 134/37 |
| 2006/0185696 A1* | 8/2006 | Yamamoto | B08B 3/02 134/33 |
| 2006/0213536 A1* | 9/2006 | Sato | 134/6 |
| 2006/0219260 A1* | 10/2006 | Iwami et al. | 134/6 |
| 2006/0231125 A1* | 10/2006 | Yi | 134/33 |
| 2008/0163899 A1* | 7/2008 | Takiguchi | H01L 21/67028 134/30 |
| 2009/0314311 A1* | 12/2009 | Mouri | A46B 9/005 134/6 |
| 2011/0277793 A1* | 11/2011 | Inada | H01L 21/67051 134/18 |
| 2013/0068264 A1* | 3/2013 | Jang | H01L 21/67051 134/157 |
| 2013/0255031 A1* | 10/2013 | Nishiyama | H01L 21/67046 15/383 |

FOREIGN PATENT DOCUMENTS

| | | |
|---|---|---|
| JP | 10-059540 | 3/1998 |
| JP | 10-335287 | 12/1998 |
| JP | 11-163094 | 6/1999 |
| JP | 3354367 | 9/2002 |
| JP | 2004-356517 | 12/2004 |
| JP | 2009-295751 | 12/2009 |
| JP | 2013-229409 | 11/2013 |

\* cited by examiner

SUBSTRATE HOLDING APPARATUS AND SUBSTRATE CLEANING APPARATUS

CROSS REFERENCE TO RELATED APPLICATION

This application claims priority to Japanese Patent Application No. 2013-131409 filed Jun. 24, 2013, the entire contents of which are hereby incorporated by reference.

BACKGROUND

A substrate cleaning apparatus for processing substrates, such as wafers, has a substrate holding device for holding and rotating a substrate. The substrate holding device is configured to hold a peripheral edge of a substrate with a plurality of chucks. While a wafer (or substrate) is held and rotated by the chucks, a cleaning tool, such as a roll sponge or a pen sponge, is brought into contact with a surface of the wafer in the presence of a cleaning liquid, thereby cleaning the surface of the wafer.

Wafers having a diameter of 300 mm are expected to be replaced with wafers having a diameter of 450 mm in the near future. However, the increase in wafer size may cause the following problems. When four equally-spaced chucks grip a wafer having a diameter of 450 mm, the wafer bends between adjacent two of the chucks and an amount of deflection reaches about 0.5 mm. This amount of deflection is about five times the amount of deflection when a wafer having a diameter of 300 mm is held by the four chucks. If the cleaning tool is pressed against the surface of the wafer that bends largely while it is in rotation, the cleaning tool does not uniformly contact the wafer and is unable to clean the surface of the wafer uniformly. Moreover, the contact with the cleaning tool may cause the wafer to further bend, and may possibly result in a crack in the wafer.

It is possible to reduce the amount of wafer deflection by using an increased number of chucks. However, the increase in the number of chucks may give rise to a new problem that a hand of a transfer robot is likely to contact the chucks when the transfer robot transports the wafer. Moreover, it is difficult to reduce the size of the hand and it is also difficult to provide a recess in the hand for making the hand stay clear of the chucks because it is necessary to ensure a mechanical strength of the hand that bears the weight of the wafer with a diameter of 450 mm.

SUMMARY OF THE INVENTION

It is therefore an object to provide a substrate holding apparatus capable of reducing an amount of deflection of a substrate, such as a wafer, while avoiding itself out of contact with a hand of a transfer robot. Another object is to provide a substrate cleaning apparatus having such a substrate holding apparatus.

Embodiments, which will be described below, relate to a substrate holding apparatus for holding a substrate, such as a wafer. The embodiments are also concerned with a substrate cleaning apparatus having such a substrate holding apparatus.

In an embodiment, there is provided a substrate holding apparatus comprising: a plurality of chucks configured to hold a peripheral edge of a substrate; at least one support member disposed below the substrate; and an actuating device configured to bring the chucks into contact with the peripheral edge of the substrate while elevating the support member to bring the support member into contact with a lower surface of the substrate, and configured to move the chucks in a direction away from the peripheral edge of the substrate while lowering the support member to separate the support member away from the lower surface of the substrate.

In an embodiment, the at least one support member comprises a plurality of support members disposed around a center of the substrate.

In an embodiment, the chucks and the support members are arranged alternately along a circumferential direction of the substrate.

In an embodiment, the actuating device comprises: a first spring configured to move the chucks until the chucks contact the peripheral edge of the substrate; a second spring configured to elevate the support member to bring the support member into contact with the lower surface of the substrate; and an actuator configured to move the chucks in the direction away from the peripheral edge of the substrate while lowering the support member away from the lower surface of the substrate.

In an embodiment, the substrate holding apparatus further comprises a rotating device configured to rotate the chucks and the support member about an axis of the substrate.

In an embodiment, there is provided a substrate cleaning apparatus comprising: the substrate holding apparatus; a cleaning liquid supply nozzle configured to supply a cleaning liquid onto the substrate when held by the substrate holding apparatus; and a cleaning tool configured to scrub the substrate in the presence of the cleaning liquid.

According to the above-described embodiments, the support member is moved in the vertical direction while the chucks are performing the substrate holding operation. More specifically, when the chucks hold the substrate, the support member supports the lower surface of the substrate, and when the chucks release the substrate, the support member is separated from the lower surface of the substrate. Therefore, the amount of the substrate deflection when the substrate is being processed can be reduced by the support member. In addition, when the substrate is to be transported, the support member is lowered to allow a hand of a transfer robot to enter a space below the substrate.

DETAILED DESCRIPTION OF AN EMBODIMENT

Figure 1:
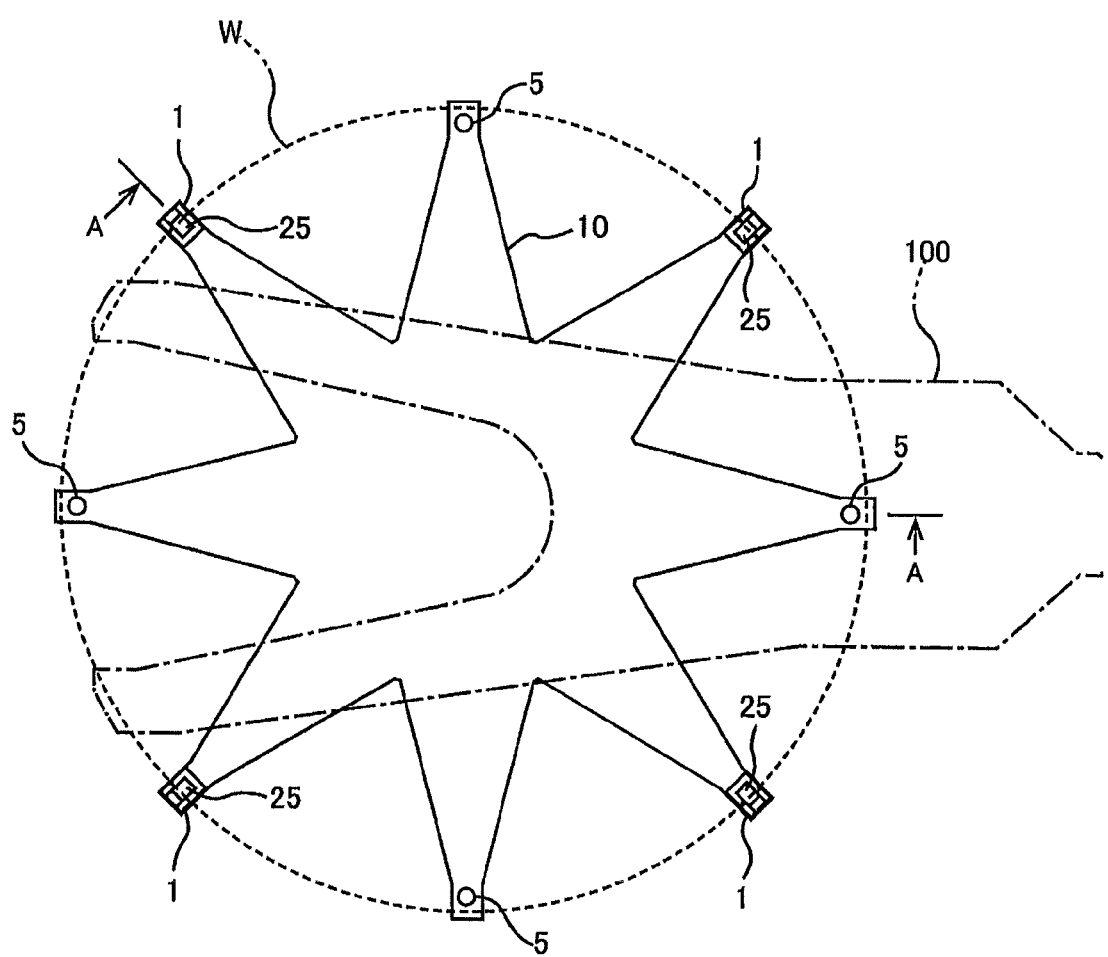
FIG. 1 is a plan view of a substrate holding apparatus according to an embodiment.
Figure 2:
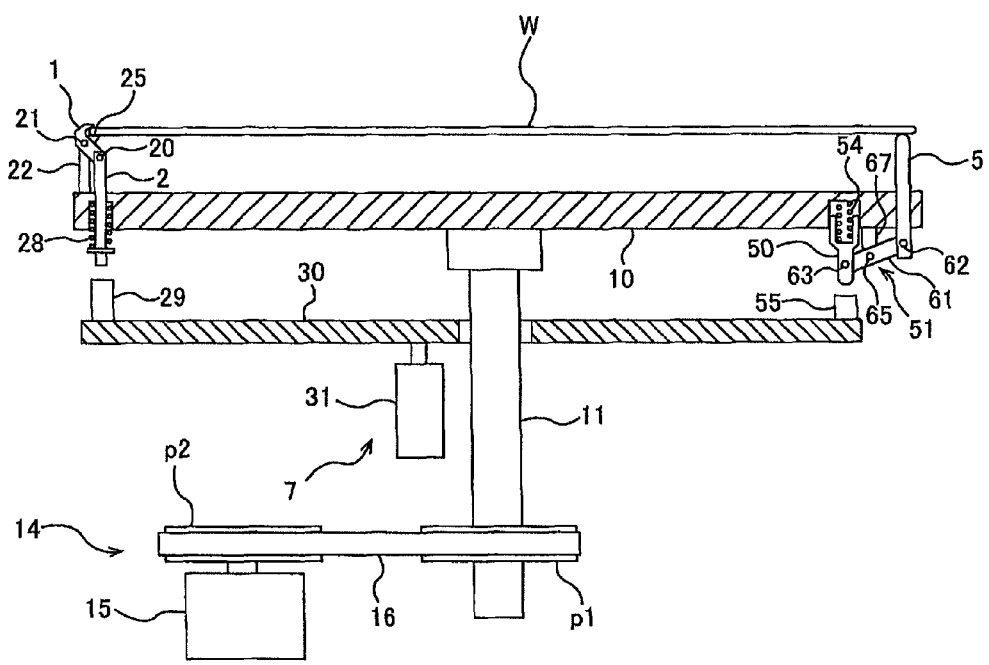
FIG. 2 is a cross-sectional view taken along line A-A in FIG. 1.

An embodiment will be described below with reference to the drawings. FIG. 1 is a plan view of a substrate holding apparatus according to an embodiment. FIG. 2 is a cross-sectional view taken along line A-A in FIG. 1. The substrate holding apparatus includes a plurality of chucks 1 for holding a peripheral edge of a wafer W which is an example of a substrate, a plurality of support pins (or support members) 5 for supporting a lower surface of the wafer W when held by the chucks 1, and an actuating device 7 for actuating the chucks 1 and the support pins 5. The support pins 5 are disposed below the wafer W that is held by the chucks 1. In this embodiment, four chucks 1 and four support pins 5 are provided. Instead of the plurality of support pins 5, a single ring member which is concentric with the wafer W may be used as the support member for supporting the lower surface of the wafer W.

The chucks 1 and the support pins 5 are arranged at equal intervals around an axis of the wafer W. Further, the chucks 1 and the support pins 5 are arranged alternately along the circumferential direction of the wafer W that is held by the chucks 1. The four chucks 1 are coupled respectively to four vertical rods 2. The vertical rods 2 and the support pins 5 are vertically movably supported by a rotary table 10.

The rotary table 10 is fixed to a rotational shaft 11, which is rotatably supported by bearings (not shown in the drawings) so that the rotary table 10 can rotate together with the rotational shaft 11. A rotating device 14 is coupled to the rotational shaft 11. The rotating device 14 includes a pulley p1 fixed to the rotational shaft 11, a motor 15, a pulley p2 fixed to a drive shaft of the motor 15, and a belt 16 riding on the pulleys p1, p2. The drive force of the motor 15 is transmitted through the pulleys p1, p2 and the belt 16 to the rotational shaft 11 and the rotary table 10, so that the chucks 1 and the support pins 5, which are supported by the rotary table 10, are rotated about the axis of the wafer W.

The chucks 1 are coupled to the vertical rods 2 by joints 20, respectively, so as to be able to rotate about the joints 20. Further, the chucks 1 are rotatably supported by support shafts 21, respectively. When the vertical rods 2 are vertically moved, the chucks 1 are rotated about the support shafts 21, which are supported by support posts 22 mounted fixedly to the rotary table 10. The support posts 22 have upper surfaces serving as flat substrate support surfaces 25 on which the wafer W is placed.

Each vertical rod 2 and the rotary table 10 are coupled to each other by a first spring 28. The first spring 28 has an upper end held in contact with the rotary table 10 and a lower end held in contact with the vertical rod 2. Therefore, the vertical rods 2 are biased downwardly by the first springs 28. First lifters 29 are disposed below the vertical rods 2, respectively. These first lifters 29 are coupled to an air cylinder (or an actuator) 31 through a vertically-movable base 30.

Figure 3:
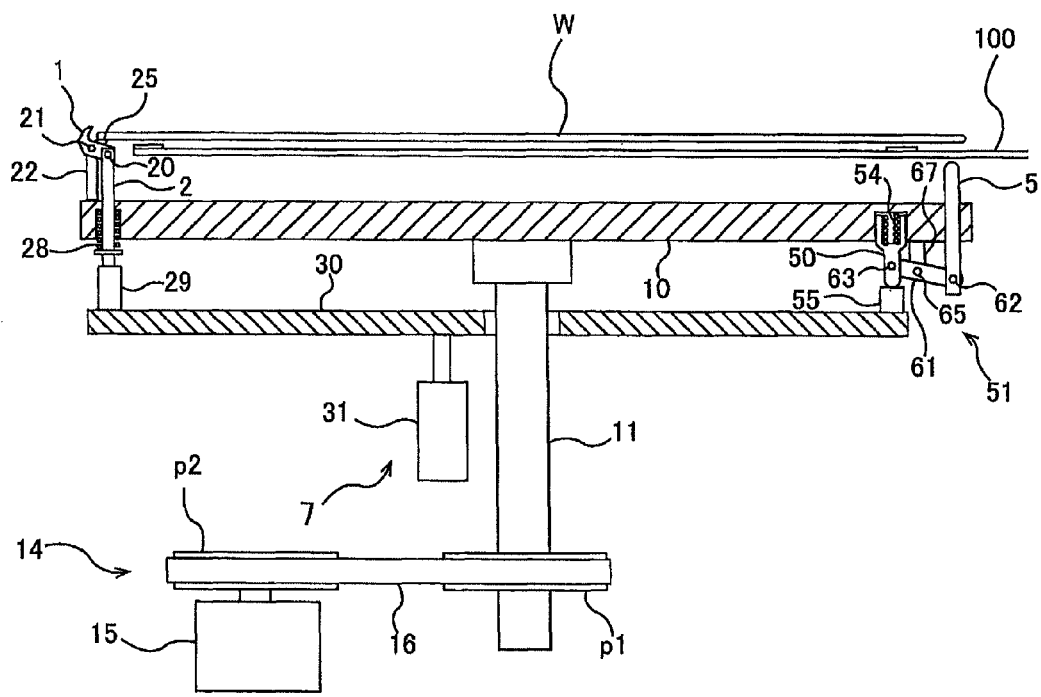
FIG. 3 is a view of the substrate holding apparatus when chucks release a wafer.

When air, serving as a working fluid, is introduced into the air cylinder 31, the air cylinder 31 elevates the vertically-movable base 30 and the first lifters 29, as shown in FIG. 3. The first lifters 29 are brought into contact with the vertical rods 2 and elevate the vertical rods 2 against the first springs 28. When the supply of the air into the air cylinder 31 is stopped, the vertical rods 2 are lowered by the first springs 28. In this manner, the vertical rods 2 are moved upwardly by the air cylinder 31, and moved downwardly by the first springs 28. Instead of the air cylinder 31, a combination of a ball screw mechanism and a servomotor may be used as the actuator.

Although not shown in the drawings, four first lifters 29 in alignment with the corresponding four vertical rods 2 are fixed to the vertically-movable base 30. These four vertical rods 2 are synchronously moved upwardly by the common air cylinder 31. As the vertical rods 2 are elevated, the chucks 1 are rotated in a direction away from the peripheral edge of the wafer W that is placed on the substrate support surfaces 25, as shown in FIG. 3. When a piston of the air cylinder 31 is lowered, the four vertical rods 2 are synchronously lowered by the four first springs 28. As the vertical rods 2 are lowered, the chucks 1 are rotated in a direction toward the peripheral edge of the wafer W on the substrate support surfaces 25 until the chucks 1 are brought into contact with the peripheral edge of the wafer W, thereby holding the wafer W, as shown in FIG. 2. In this manner, a force of holding the wafer W is generated by the first springs 28, and a force of releasing the wafer W is generated by the air cylinder 31.

The support pins 5 are coupled to vertically-movable pins (vertically-movable members) 50 through linkages 51, respectively. The support pins 5 and the vertically-movable pins 50 extend in the vertical direction. The vertically-movable pins 50 are vertically movably supported by the rotary table 10. Second springs 54 are disposed between the vertically-movable pins 50 and the rotary table 10. Each of the second springs 54 has an upper end held in contact with the rotary table 10 and a lower end held in contact with each vertically-movable pin 50. Therefore, the vertically-movable pins 50 are biased downwardly by the second springs 54. Second lifters 55 are disposed below the vertically-movable pins 50. These second lifters 55 are coupled to the air cylinder 31 through the vertically-movable base 30. The vertically-movable pins 50 are thus moved upwardly by the air cylinder 31, and moved downwardly by the second springs 54.

Each linkage 51 includes a link 61 extending between the support pin 5 and the vertically-movable pin 50, a joint 62 for coupling one end of the link 61 to the support pin 5, and a joint 63 for coupling the other end of the link 61 to the vertically-movable pin 50. The link 61 is rotatably supported by a support shaft 65, which is held by a support post 67 fixed to the rotary table 10. The support shaft 65 is located between the joint 62 and the joint 63. Therefore, when the vertically-movable pin 50 is elevated, the link 61 is rotated about the support shaft 65 to lower the support pin 5, as shown in FIG. 3. When the vertically-movable pin 50 is lowered, the link 61 is rotated about the support shaft 65 in the opposite direction to elevate the support pin 5, as shown in FIG. 2. In this manner, the support pins 5 are moved downwardly by the air cylinder 31, and moved upwardly by the second springs 54. When the support pins 5 are in their elevated positions, upper ends of the support pins 5 are located at the same height as the substrate support surfaces 25.

Although not shown, four second lifters 55 in alignment with the corresponding four vertically-movable pins 50 are fixed to the vertically-movable base 30. The four vertically-movable pins 50 are synchronously moved upwardly by the common air cylinder 31. As the vertically-movable pins 50 are elevated, the support pins 5 are lowered away from the wafer W, as shown in FIG. 3. When the support pins 5 are in their lowered positions, a hand 100 of a transfer robot is able to enter a space defined below the wafer W without contacting the support pins 5. Therefore, the hand 100 of the transfer robot introduces and removes the wafer W when the support pins 5 are in the lowered positions as shown in FIG. 3.

For allowing the transfer robot to transport the wafer W into the substrate holding apparatus, the support pins 5 are lowered as shown in FIG. 3. In this state, the wafer W is placed onto the substrate support surfaces 25 by the hand 100 of the transfer robot. Thereafter, the piston of the air cylinder 31 is lowered so that the four vertically-movable pins 50 are synchronously lowered by the four second springs 54. As the vertically-movable pins 50 are lowered, the support pins 5 are elevated to contact the lower surface of the wafer W, thereby supporting the wafer W thereon, as shown in FIG. 2.

During processing (e.g., cleaning) of the wafer W, the wafer W is supported by both the chucks 1 and the support pins 5. Therefore, the amount of deflection of the wafer W is reduced, so that the wafer W can have its surface processed uniformly and is prevented from cracking.

As described above, the air cylinder 31 elevates the common vertically-movable base 30 to thereby separate the chucks 1 away from the wafer W while lowering the support pins 5. When the air cylinder 31 lowers the common vertically-movable base 30, the first springs 28 move the chucks 1 in a direction as to contact the peripheral edge of the wafer W while the second springs 54 elevate the support pins 5 until the support pins 5 contact the lower surface of the wafer W. Therefore, in this embodiment, the actuating device 7 for actuating the chucks 1 and the support pins 5 is constituted by at least the air cylinder 31, the first springs 28, and the second springs 54.

Figure 4:
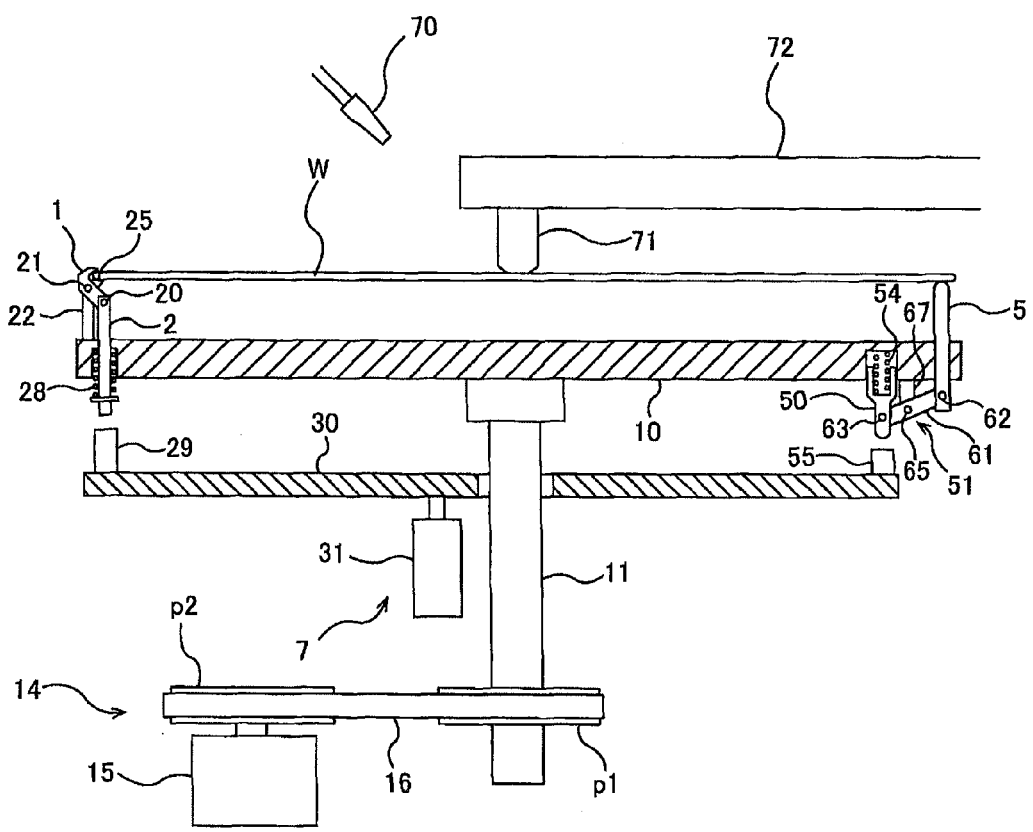
FIG. 4 a view of a substrate cleaning apparatus which incorporates the substrate holding apparatus.

FIG. 4 is a view showing an example in which the above-discussed substrate holding apparatus is applied to a substrate cleaning apparatus for cleaning a substrate, such as a wafer. As shown in FIG. 4, the substrate cleaning apparatus includes the above-discussed substrate holding apparatus for holding and rotating the wafer W horizontally, a cleaning liquid supply nozzle 70 for supplying a cleaning liquid onto the surface of the wafer W when held by the substrate holding apparatus, and a cleaning tool 71 for scrubbing the surface of the wafer W. The cleaning liquid may be a chemical solution and/or pure water. The cleaning tool 71 is held on a distal end of an arm 72 and is rotated by a motor (not shown) provided in the arm 72. The cleaning tool 71 shown in FIG. 4 is a so-called pen-sponge type cleaning tool.

Figure 5:
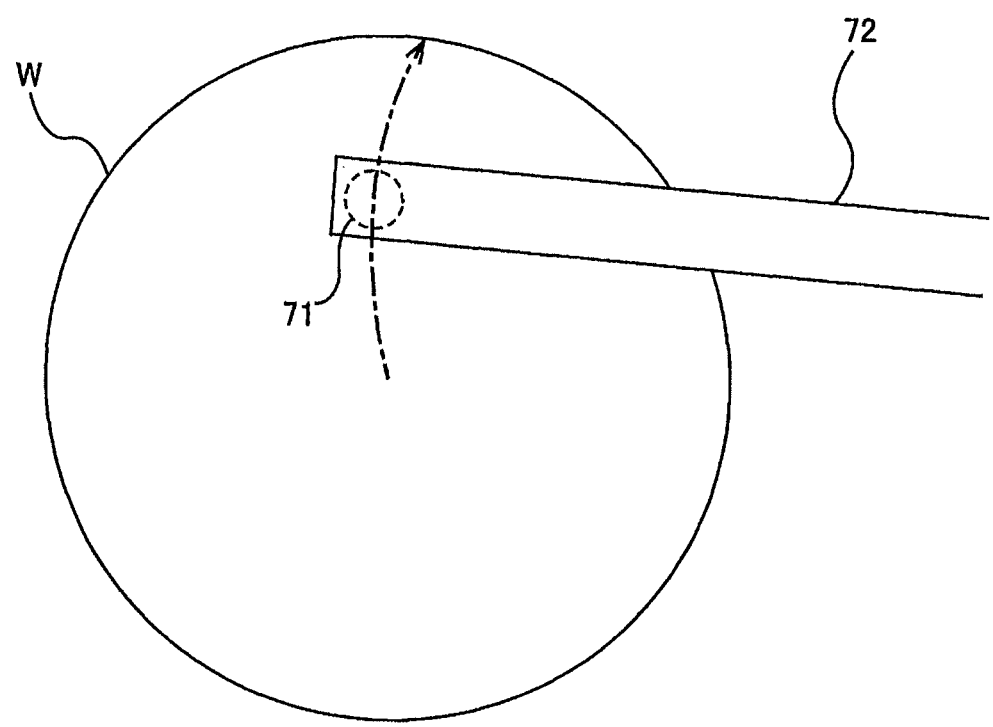
FIG. 5 is a plan view of a cleaning tool that is moving on the wafer in substantially a radial direction of the wafer.

Cleaning of the wafer W is performed as follows. The wafer W is rotated by the substrate holding apparatus, and the cleaning liquid is supplied onto the surface of the wafer W. While the cleaning tool 71 is held in contact with the surface of the wafer W, the cleaning tool 71 is rotated. As shown in FIG. 5, the arm 72 moves the cleaning tool 71 substantially in the radial direction of the wafer W. The surface of the wafer W is scrubbed by the cleaning tool 71 in the presence of the cleaning liquid.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims and equivalents.

What is claimed is:

1. A substrate holding apparatus comprising:
    a plurality of chucks configured to hold a peripheral edge of a substrate;
    at least one support member disposed below the substrate; and
    an actuating device configured to bring the chucks into contact with the peripheral edge of the substrate while elevating the support member to bring the support member into contact with a lower surface of the substrate, and configured to move the chucks in a direction away from the peripheral edge of the substrate while lowering the support member to separate the support member away from the lower surface of the substrate.

2. The substrate holding apparatus according to claim 1, wherein the at least one support member comprises a plurality of support members disposed around a center of the substrate.

3. The substrate holding apparatus according to claim 2, wherein the chucks and the support members are arranged alternately along a circumferential direction of the substrate.

4. The substrate holding apparatus according to claim 1, wherein the actuating device comprises:
    a first spring configured to move the chucks until the chucks contact the peripheral edge of the substrate;
    a second spring configured to elevate the support member to bring the support member into contact with the lower surface of the substrate; and
    an actuator configured to move the chucks in the direction away from the peripheral edge of the substrate while lowering the support member away from the lower surface of the substrate.

5. The substrate holding apparatus according to claim 1, further comprising:
    a rotating device configured to rotate the chucks and the support member about an axis of the substrate.

6. A substrate cleaning apparatus comprising:
    a plurality of chucks configured to hold a peripheral edge of a substrate;
    at least one support member disposed below the substrate;
    an actuating device configured to bring the chucks into contact with the peripheral edge of the substrate while elevating the support member to bring the support member into contact with a lower surface of the substrate, and configured to move the chucks in a direction away from the peripheral edge of the substrate while lowering the support member to separate the support member away from the lower surface of the substrate;
    a cleaning liquid supply nozzle configured to supply a cleaning liquid onto the substrate when held by the substrate holding apparatus; and
    a cleaning tool configured to scrub the substrate in the presence of the cleaning liquid.

7. The substrate holding apparatus according to claim 1, further comprising:
    support posts having substrate support surfaces on which the substrate can be placed.

8. The substrate holding apparatus according to claim 7, further comprising:
    support shafts which rotatably support the chucks, respectively, the support shafts being supported by the support posts.

* * * * *